United States Patent
Shakuda et al.

(10) Patent No.: US 7,034,342 B2
(45) Date of Patent: Apr. 25, 2006

(54) SEMICONDUCTOR LIGHT EMITTING DEVICE

(75) Inventors: Yukio Shakuda, Kyoto (JP); Yukio Matsumoto, Kyoto (JP); Nobuaki Oguro, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 242 days.

(21) Appl. No.: 10/682,518

(22) Filed: Oct. 10, 2003

(65) Prior Publication Data

US 2004/0075095 A1    Apr. 22, 2004

(30) Foreign Application Priority Data

Oct. 11, 2002   (JP)   ............................. 2002-299010

(51) Int. Cl.
    *H01L 33/00*    (2006.01)
(52) U.S. Cl. ............................. 257/94; 257/86; 257/96; 257/98; 257/103
(58) Field of Classification Search ...................... None
    See application file for complete search history.

(56) References Cited

U.S. PATENT DOCUMENTS 6,469,324 B1 *  10/2002  Wang ........................... 257/98
6,635,905 B1 *  10/2003  Nido et al. ................. 257/103

FOREIGN PATENT DOCUMENTS

| JP | 55-91890 | 7/1980 |
| JP | 02-146779 | 6/1990 |
| JP | 2001-185756 | 7/2001 |

OTHER PUBLICATIONS

Gardner et al., 14x efficiency improvement in transparent-substrate $(Al_xGa_{1-x})_{0.5}In_{0.5}P$ light-emitting diodes with thin ($\leq 2000\text{Å}$) active regions; Apr. 12, 1999; Applied Physics Letters; vol. 74 No. 15; p2230-2232.

* cited by examiner

*Primary Examiner*—Long Pham
*Assistant Examiner*—Wai-Sing Louie
(74) *Attorney, Agent, or Firm*—Rabin & Berdo, PC

(57) ABSTRACT

A light emitting layer forming portion is provided on a semiconductor substrate, in which an active layer made of a compound semiconductor is sandwiched between a first and second clad layers made of compound semiconductor having band gap greater than that of the active layer, respectively and having a different conductivity type each other and furthermore a window layer is provided above the second clad layer. The second clad layer is made of a semiconductor having refractive index greater than that of the first clad layer. More preferably the window layer is made of a semiconductor having a refractive index greater than that of the second clad layer. As a result, the absorption of the light emitted from the light emitting layer in the semiconductor substrate can be reduced, and the light can be attracted toward the top surface so that the external quantum efficiency can be advanced.

7 Claims, 4 Drawing Sheets

SEMICONDUCTOR LIGHT EMITTING DEVICE

FIELD OF THE INVENTION

The present invention relates to a semiconductor light emitting device that employs compound semiconductor material such as AlGaAs based compound or InGaAlP based compound and that is used for LED display or the like, and in particular to a semiconductor light emitting device wherein the efficiency of emitting light has been advanced.

BACKGROUND OF THE INVENTION

In a conventional semiconductor light emitting device that employs an InGaAlP based compound semiconductor, a first clad layer 2 made of an InGaAlP based semiconductor material, an active layer 3 made of a non-doped InGaAlP based semiconductor material having a composition wherein the band gap is smaller than that of the first clad layer, and a second clad layer 4 having the same composition as that of the first clad layer, respectively have been epitaxially grown on a semiconductor substrate 1 made of, for example, an n-type GaAs as shown in FIG. 3A so that a light emitting layer forming portion 9 of a double hetero-junction structure is formed. A window layer 5 made of an AlGaAs based semiconductor material having approximately the same refractive index as that of the clad layers, is further deposited on the front side of the light emitting layer forming portion 9, and furthermore a p-side electrode 7 made of an Au—Ge/Ni alloy is provided in a part of the surface of the window layer 5 via a contact layer 6 made of a p-type GaAs while an n-side electrode 8 made of an Au—Ge/Ni alloy is provided on a rear side of the semiconductor substrate 1. And a wafer in which the above processes are performed is divided into chips.

Carriers are confined in the active layer by adopting a double hetero-structure in the conventional structure, and a difference of refractive indexes is formed in the direction perpendicular to a surface of the substrate so that light is confined in the active layer having a refractive index higher than that of the clad layers. Though no problem arises in a semiconductor laser that emits light from an edge surface wherein carriers and light are confined in the active layer, in the case of an LED in which light is emitted from a top surface of an LED as shown in FIG. 3A, light cannot be effectively emitted from the top surface, if light is confined too strongly in the active layer.

On the other hand, in order to solve such a problem, an LED chip has been proposed, which has a structure wherein exuding of light from the active layer is increased so as to increase the amount of light that proceeds to the top surface and increases the efficiency of the emission of light from the top surface (hereinafter referred to as "external quantum efficiency") by making the active layer a thin film, as shown in FIG. 4A. In this case, however, the light released to the substrate from the active layer is simultaneously increased when the exuding of light is increased. Light emitted from the active layer to the substrate is absorbed by the GaAs substrate and the external quantum efficiency is not substantially increased in the case wherein, for example, a GaAs substrate having the band gap smaller than that of the active layer is used.

The usage of a GaP substrate which does not absorb light while making the active layer thinner as described above is described in "1.4×efficiency improvement in transparent-substrate $(Al_xGa_{1-x})_{0.5}In_{0.5}P$ light-emitting diodes with thin ($\leqq 2000$ Å) active regions" by N. F. Gardner et al, Applied Physics Letters Volume 74 No. 15 pp 2230–2232, Apr. $12^{th}$ 1999. In this case, however, a problem arises wherein the manufacturer requires an adhesion process which is significantly complicated and is very costly.

Furthermore, the current density increases in the active layer and temperature increases in the active layer to affect the reliability of the device in the case wherein the active layer is made into a thin film.

SUMMARY OF THE INVENTION

The present invention is directed in order to solve such problems and an object of the present invention is to provide a semiconductor light emitting device wherein the amount of absorption of light, which has been emitted in the light emitting layer, in the semiconductor substrate is reduced and wherein light can be attracted toward the top surface so as to enhance the external quantum efficiency.

A semiconductor light emitting device according to the present invention includes; a semiconductor substrate, a light emitting layer forming portion provided on the semiconductor substrate wherein an active layer made of a compound semiconductor is sandwiched between a first clad layer and a second clad layer made of compound semiconductors having band gaps greater than that of the active layer and having a different conductivity type each other, and a window layer provided at least above the second clad layer, wherein the second clad layer is formed of a compound semiconductor having a refractive index greater than that of the first clad layer that is located on the semiconductor substrate side. Furthermore, it is preferable for the window layer to be formed of a compound semiconductor having a refractive index greater than that of the second clad layer so that the substantial difference of the refractive indexes (effective refractive index difference) can be reduced.

The light emitted from the active layer is attracted to the second clad layer side having a greater refractive index in this structure and thereby the external quantum efficiency can be enhanced without making the active layer a thin film. That is to say, the refractive index of the second clad layer is greater than the refractive index of the first clad layer and therefore the light that would originally spread toward the substrate side is attracted to the second clad layer side having a higher refractive index, and the amount of light that exudes toward the semiconductor substrate side is reduced in comparison with the conventional structure and thereby light absorption in the semiconductor substrate can be reduced so that the external quantum efficiency can be enhanced. In addition the amount of the light that exudes toward the semiconductor substrate side can be further restricted and as a result the film thickness of the first clad layer can be reduced so that the reduction of the time for the growth of the film can be achieved in the case wherein a layer having a refractive index smaller than that of the second clad layer is used as the first clad layer.

Furthermore, the window layer is made of a material having a refractive index greater than that of the second clad layer, and thereby the light that has been attracted to the second clad layer is further attracted to the window layer side so that the external quantum efficiency can further be enhanced. That is to say, the refractive index of the second clad layer adjoining to the active layer is made to be smaller than that of the active layer, and the refractive index of the window layer provided at a position at a certain distance away from the active layer is made to be greater than that of the second clad layer, and thereby the difference of the refractive indexes that light actually reacts to (hereinafter referred to as "effective refractive index difference") becomes smaller than the theoretical difference of the refractive indexes between the active layer and the second clad layer so that the light attracting effect is further enhanced in comparison with the case wherein the refractive index of the second clad layer alone is increased.

In addition it becomes unnecessary to significantly increase the refractive index of the second clad layer (that is to say to reduce the band gap) due to this light attracting effect, and thus the difference of the band gaps between the active layer and the second clad layer is not reduced and the effects of carrier confinement is not reduced so that the external quantum efficiency can further be enhanced.

DETAILED DESCRIPTION OF THE INVENTION

Next a semiconductor light emitting device according to the present invention is described in reference to the drawings.

Figure 1A:
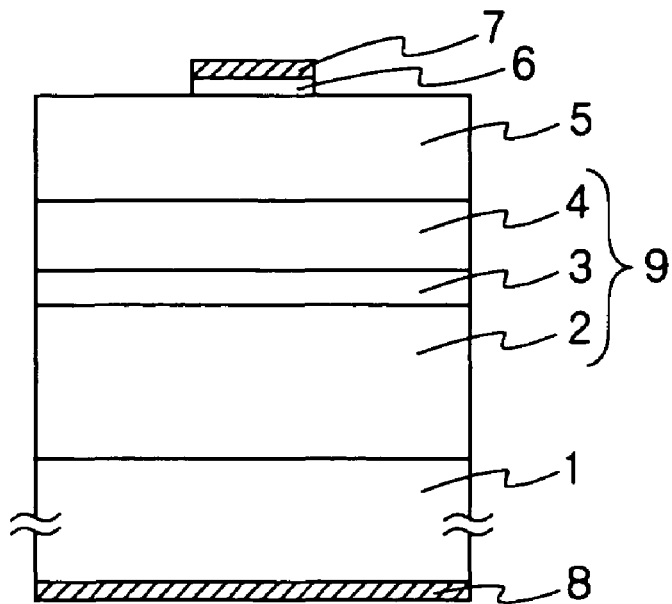
FIG. 1A is a diagram showing a cross sectional structure of an LED chip according to one embodiment of the present invention.

FIG. 1A shows the cross sectional structure of an LED chip of a semiconductor light emitting device according to one embodiment of the present invention. A light emitting layer forming portion 9 is provided on a semiconductor substrate 1, in which an active layer 3 made of a compound semiconductor is sandwiched between a first clad layer 2 and a second clad layer 4 made of compound semiconductor having band gap greater than that of the active layer 3, respectively and having a different conductivity type each other. And furthermore a window layer 5 is provided on the second clad layer 4 of the light emitting layer forming portion 9. The present invention is characterised in that the second clad layer 4 is made of a semiconductor material having a refractive index greater than that of the first clad layer 2. Furthermore the window layer 5 may be made of a semiconductor material having a refractive index greater than that of the second clad layer 4.

GaAs is generally used for the semiconductor substrate 1, when semiconductor layers made of AlGaAs based compound or InGaAlP based compound are grown on the semiconductor substrate 1. In this case, as light is absorbed by the semiconductor substrate, the effect of the present invention is especially expected, but the semiconductor substrate 1 made of GaP or the like which is transparent for the emitted light may have similar effects. In addition, the semiconductor substrate 1 may be either of p-type or n-type, which is determined by the relationship with the conductivity type of the first clad layer 2 and the second clad layer 4 grown on the semiconductor substrate 1. Furthermore, in some cases a buffer layer made of the same kind material as the semiconductor substrate 1 is provided on the semiconductor substrate 1 as below described.

The light emitting layer forming portion 9 in the example shown in FIG. 1 is formed to have a double hetero-structure, in which the active layer 3 is sandwiched between the first clad layer 2 and the second clad layer 4 made of a material having a band gap greater than that of the active layer 3 and having a refractive index smaller than that of the active layer 3, respectively wherein the first clad layer 2 is provided on the semiconductor substrate 1 side. As for the semiconductor material, an InGaAlP based material, for example, is used in order to emit red light, and an AlGaAs based material is mainly used in order to emit infra-red light. This light emitting layer forming portion 9 is grown to have a required composition depending on the wave length of light emitted according to a required device (mixed crystal ratio of Al may be changed or a dopant may be doped) and is grown to have a required thickness.

Here, InGaAlP based material indicates a material represented by the form of $In_{0.49}(Ga_{1-x}Al_x)_{0.51}P$ wherein the value of x varies between 0 and 1. Mixed crystal ratio of 0.49 and 0.51 of In and $(Al_xGa_{1-x})$ indicates a ratio of a lattice matching of the InGaAlP based material and the semiconductor substrate such as of GaAs on which the InGaAlP based material is layered. And AlGaAs based material indicates a material represented in the form of $Al_yGa_{1-y}As$ wherein the value of y varies between 0 and 1.

The second clad layer 4 is made of a compound semiconductor having a refractive index greater than that of the first clad layer 2. Though it is preferable that the refraction index of the second clad layer 4 is greater than that of the first clad layer 2, the internal light emitting efficiency is lowered in relation to the below described band gap in the case that the refractive index of the second clad layer is increased to too large a degree, and therefore the refractive ratio of the second clad layer must be greater than the first clad layer by approximately 6% or less, preferably from approximately 6% to 4%, and more preferably by approximately 5%. The refractive index of the clad layers can generally be changed by altering the mixed ratio of the Ga and Al crystal mixture in InGaAlP based material and in AlGaAs based material.

That is to say, the band gap increases and the refractive index decreases when the mixture (mixed crystal) ratio of the Al is increased, on the other hand the band gap decreases and the refractive index increases when the mixed crystal ratio of the Al is decreased. Accordingly, the second clad layer 4 is made of a compound semiconductor layer having a mixture ratio of the Al smaller than that of the first clad layer 2. On the other hand, the band gap becomes too small, leading to weakening of the carrier confinement and lowering of the internal light emitting efficiency and, therefore, a lower limit in the mixture ratio of the Al is created.

In the case of an InGaAlP based compound semiconductor, a concrete example can be cited wherein; the first clad layer 2 (an n-type clad layer), made of $In_{0.49}(Ga_{1-s}Al_s)_{0.51}P$ ($0.6 \leq s \leq 1$, for example s=0.9) in which Se is doped, having a carrier concentration of from approximately $1 \times 10^{17}$ cm$^{-3}$ to $1 \times 10^{19}$ cm$^{-3}$ and having a thickness of from approximately 0.1 µm to 2 µm; the active layer 3, made of $In_{0.49}(Ga_{1-x}Al_x)_{0.51}P$ ($0 \leq x \leq 0.3$, for example $x=0.05$) which is non-doped, having a thickness of from approximately 0.1 µm to 2 µm; and the second clad layer 4 (a p-type clad layer), made of $In_{0.49}(Ga_{1-y}Al_y)_{0.51}P$ ($0.4 \leq y \leq 0.75$, $y<s$, for example $y=0.45$) in which Zn is doped, having a carrier concentration of from approximately $1 \times 10^{18}$ cm$^{-3}$ to $1 \times 10^{19}$ cm$^{-3}$ having a thickness of from approximately 0.1 µm to 2 µm and having a refractive index greater than that of the first clad layer 2; form a layered structure.

On the other hand, in the case of an AlGaAs based compound semiconductor; the n-type first clad layer 2, made of $Al_zGa_{1-z}As$ ($0.6 \leq z \leq 0.9$, for example $z=0.85$) in which Se is doped, having a carrier concentration of from approximately $1 \times 10^{17}$ cm$^{-3}$ to $1 \times 10^{19}$ cm$^{-3}$ and having a thickness of from approximately 0.1 µm to 2 µm; the active layer 3, made of $Al_{0.2}Ga_{0.8}As$ which is non-doped, having a thickness of from approximately 0.1 µm to 2 µm; and the second clad layer 4 (the p-type clad layer), made of $Al_uGa_{1-u}As$ ($0.4<u \leq 0.85$, $u<z$, for example $u=0.5$) in which Zn is doped, having a carrier concentration of from approximately $1 \times 10^{18}$ cm$^{-3}$ to $1 \times 10^{19}$ cm$^{-3}$ having a thickness of from approximately 0.1 µm to 2 µm and having a refractive index greater than that of the first clad layer 2 (the n-type clad layer); form a layered structure.

The window layer 5 is made of a compound semiconductor having a refractive index greater than that of the second clad layer 4, and its function is to spread current that is injected into the second clad layer 4 and, therefore, the window layer 5 may be formed in any position over the second clad layer 4, that is to say, the window layer 5 may be placed so as to make contact with the second clad layer 4 or may make contact with the p-type electrode 7 so as to function as an ohmic contact layer.

According to the present embodiment, the window layer 5 provided on the second clad layer 4 of the light emitting layer forming portion 9 is made of a compound semiconductor having the same conductivity type as that of the second clad layer 4, and having a refractive index greater than that of the second clad layer 4. The refractive index of the window layer 5 can be changed by altering the mixed crystal ratio of Ga and Al in InGaAlP based material or AlGaAs based material in the same manner as in the case wherein the refractive index of the clad layer is changed as described above.

The window layer 5 is made of p-type $Al_vGa_{1-v}As$ ($0.6 \leq v \leq 0.85$, for example $v=0.7$) into which Zn is doped, having a carrier concentration of from approximately $1 \times 10^{18}$ cm$^{-3}$ to $1 \times 10^{20}$ cm$^{-3}$ and having a thickness of from approximately 0.1 µm to 10 µm in the concrete example shown in FIG. 1, and may be made of an InGaAlP based compound semiconductor in another example. That is to say, the window layer 5 may be made of a material having a refractive index greater than that of the second clad layer 4, and in addition may be a layer that makes contact with the electrode as described above, and that functions as an ohmic contact layer. But it is desirable for the window layer 5 to have a band gap greater than that of the active layer 3 so that the window layer 5 does not absorb light. In the event that the clad layers are made of AlGaAs based compound semiconductor as described above, $Al_wGa_{1-w}As$ ($0.4 \leq w<0.7$, $w<u$, for example $w=0.45$) is used for the window layer, so that the refractive index of the window layer becomes greater than that of the second clad layer, thereby increasing output (extracted amount) of light.

A contact layer 6 made of, for example, a p-type GaAs is layered only under the p-side electrode 7 of the above described configuration. The contact layer 6 is not required in the case wherein the window layer 5 functions as a contact layer as described above.

Here, though not shown in the example of FIG. 1, a reflective layer (DBR) in which 5 to 40 semiconductor layers having two different refractive indexes and having a thickness of $\lambda/(4n)$ ($\lambda$ is the wavelength of the light emitted, and n is the refractive index of each semiconductor layer), respectively are alternately layered, or a buffer layer may be inserted between the first clad layer 2 and the semiconductor substrate 1. The reflective layer (DBR) can be obtained by alternatively laminating layers, having band gaps greater than those of both the active layer and the substrate, for example, films wherein the composition (mixed crystal ratio) of Al in AlGaAs is altered.

The buffer layer may be made of the same material as the semiconductor substrate 1, or may be a layer that can relieve the lattice mismatching between the semiconductor substrate 1 and the layer on the semiconductor substrate 1. The buffer layer may be made of, for example, GaAs, InGaP, or InGaAlP, in the case wherein the layer on the substrate is made of an InGaAlP based material, and the semiconductor substrate 1 is made of GaAs; and the buffer layer may be made of, for example, GaAs or AlGaAs in the case wherein the layer on the substrate is made of AlGaAs based material and the semiconductor substrate 1 is made of GaAs.

A p-side electrode 7 made of Au—Be/Ni/Ti/Au or the like is provided on the contact layer 6, and an n-side electrode 8 made of Au—Ge/Ni/Au or the like is provided on the rear side of the semiconductor substrate 1, and thereafter a wader is divided into chips.

Figure 1B:
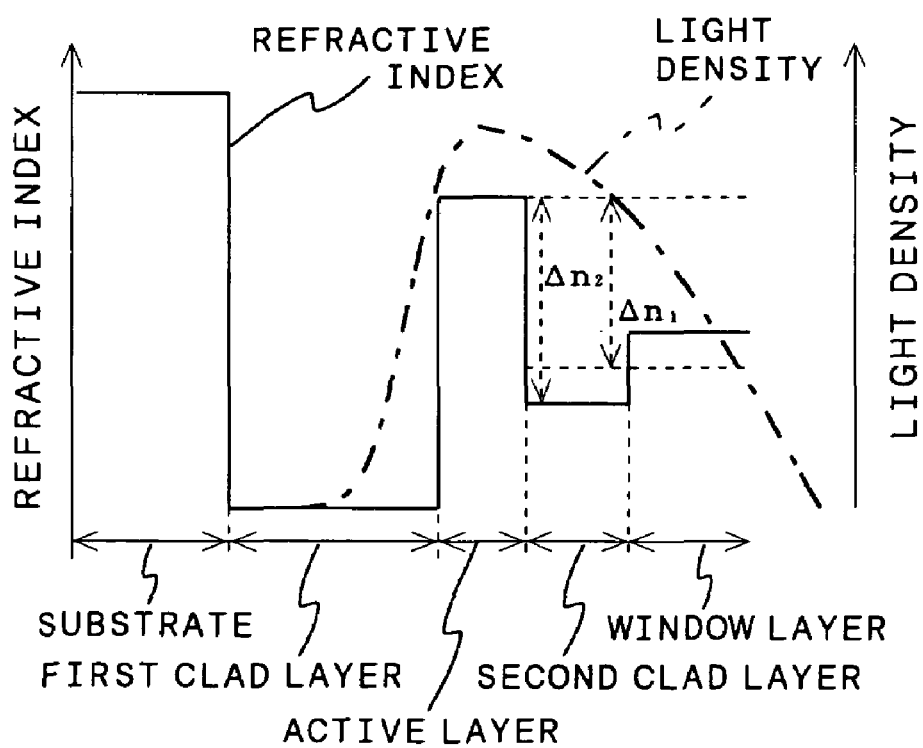
FIG. 1B is a diagram showing a refractive index distribution and a light density distribution of the LED chip of FIG. 1A.
Figure 1C:
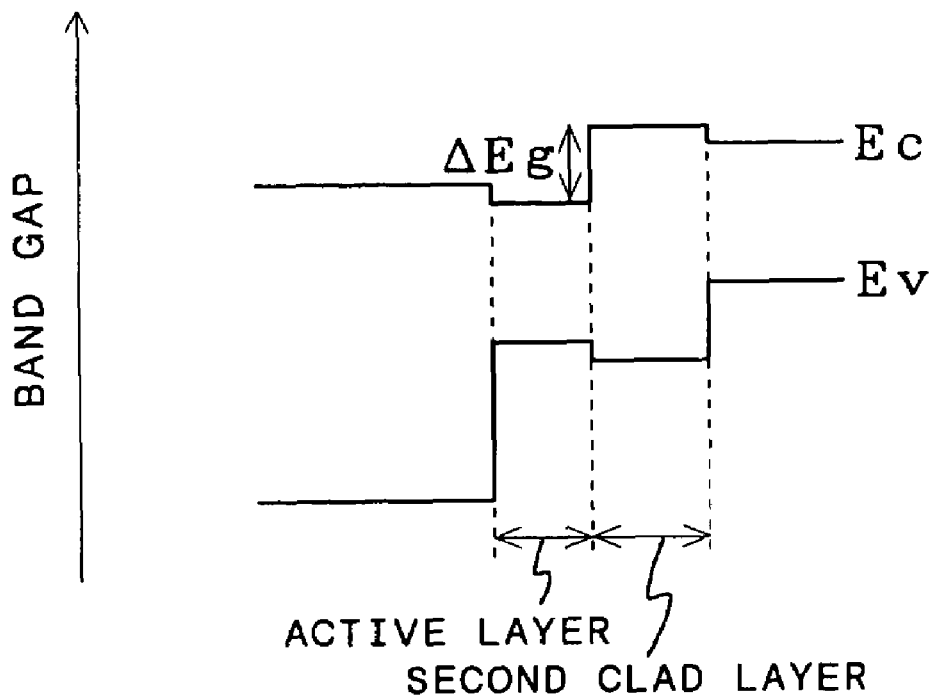
FIG. 1C is a diagram showing a band gap of the LED chip of FIG. 1A.
Figure 2:
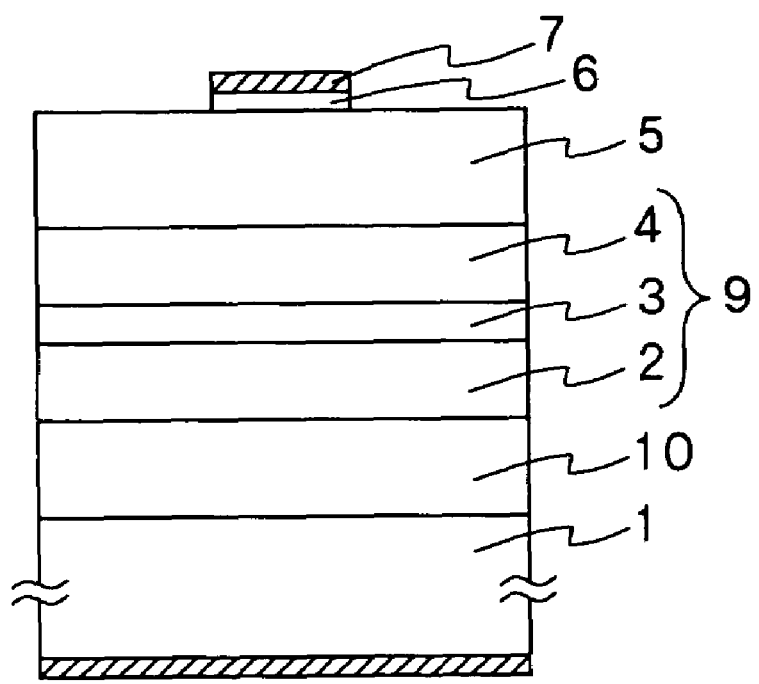
FIG. 2 is a cross sectional diagram showing an LED chip according to another embodiment of the present invention.
Figure 3A:
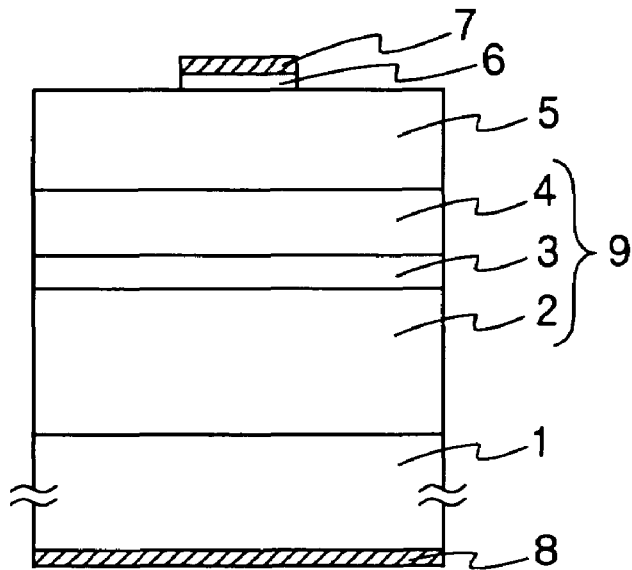
FIG. 3A is a diagram showing a cross sectional structure of an LED chip according to the prior art.
Figure 3B:
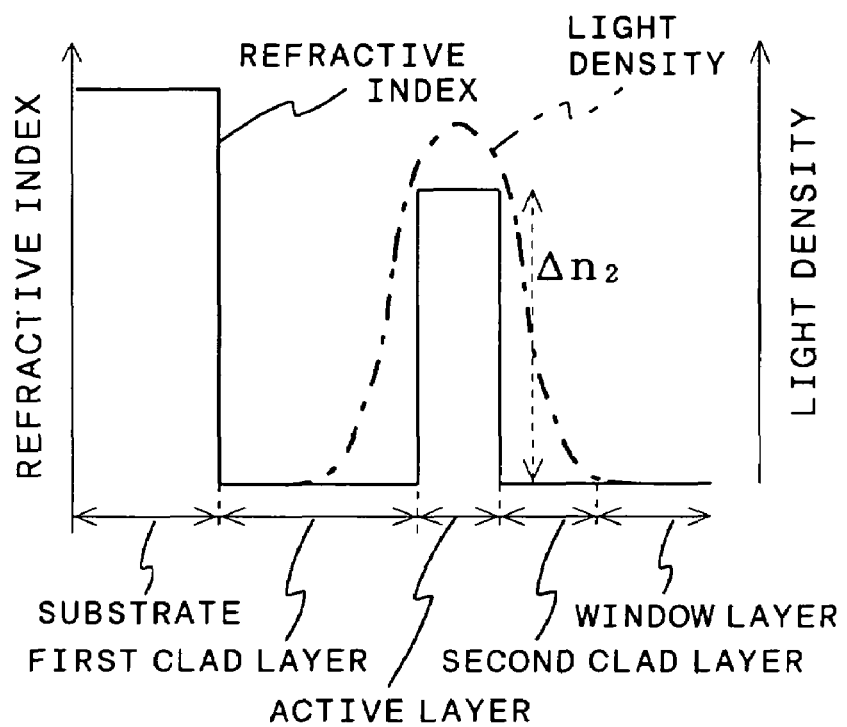
FIG. 3B is a diagram showing a refractive index distribution and a light density distribution of the LED chip according of FIG. 3A.

Next, the relationship between the refractive indexes and the band gaps of the respective layers in the present invention is described in reference to FIGS. 1B, 1C, 3B and 4B. Here, refractive index distribution wherein the active layer is located at the center, and light density distribution, are schematically represented in FIGS. 1B, 2B and 3B, while the band gap wherein the active layer is located at the center is represented in FIG. 1C.

Figure 4A:
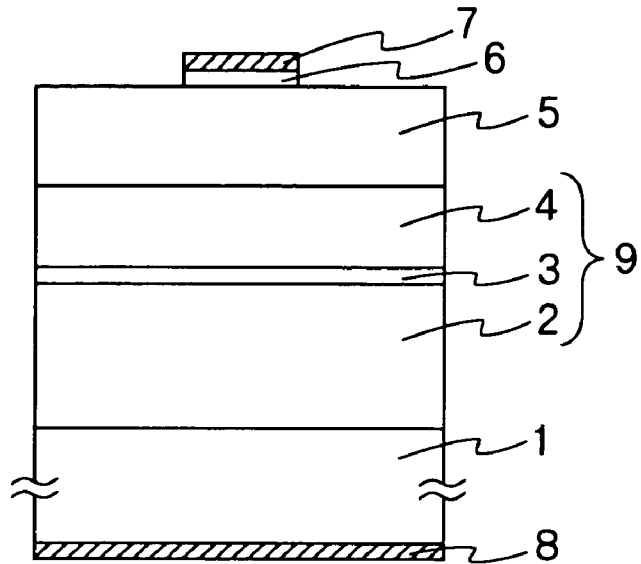
FIG. 4A is a diagram showing a cross sectional structure of an LED chip according to another example of the prior art.
Figure 4B:
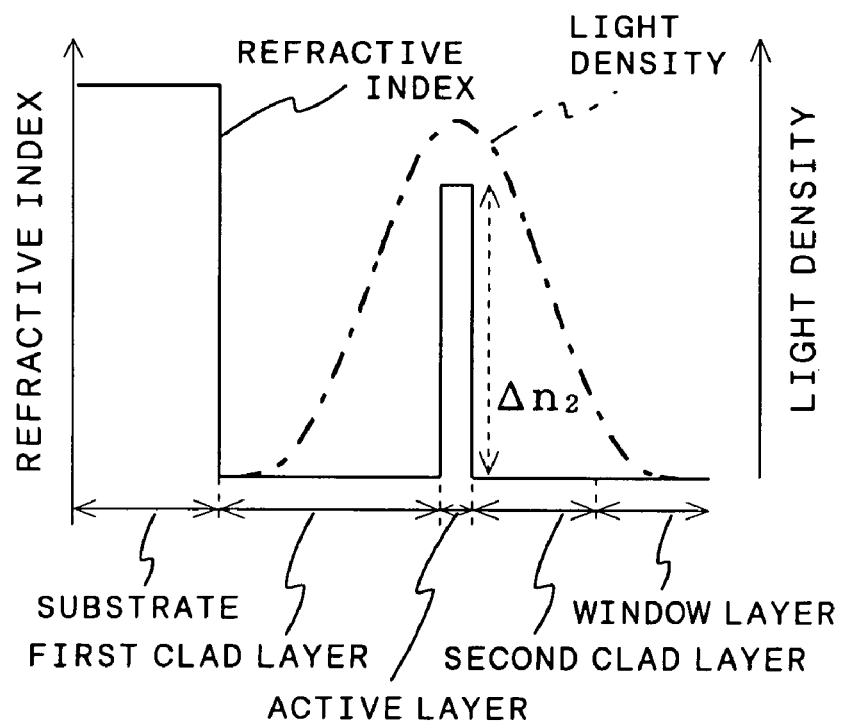
FIG. 4B is a diagram showing a refractive index distribution and a light density distribution of the LED chip of FIG. 4A.

In the conventional structure as shown in FIGS. 3B and 4B, the first clad layer 2, the second clad layer 4 and, the window layer 5 have approximately the same values in their refractive indexes, and light density distribution is symmetrical in the upward and downward directions (right and left directions in the diagrams), wherein the active layer 3 is located at the center. Here, in the conventional structure wherein the active layer is made to be a thin film as shown in FIG. 4B, light density distribution spreads toward the semiconductor substrate and toward the top surface due to an increase of exuding of light from the active layer 3.

On the other hand, in the present invention as shown in FIG. 1B, the second clad layer 4 has a refractive index greater than that of the first clad layer 2, and the window layer 5 has a refractive index greater than that of the second clad layer 4, so that light density distribution is asymmetrical in the upward and downward directions (right and left directions in FIG. 1B), wherein the active layer is located at the center and light is attracted toward the second clad layer 4. In addition, as for the relationship between the band gaps, the difference ($\Delta Eg$) between the band gaps of the active layer 3 and the second clad layer 4 is smaller than that (not shown) found in the conventional structure because the second clad layer 4 has a large refractive index as shown in FIG. 1C. Accordingly, when the refractive index of the second clad layer is increased to too great a degree in attempting to enhance light attraction, the difference ($\Delta Eg$) between the band gaps of the active layer and the second clad layer is lowered and the problem arises wherein the effectiveness of carrier confinement is weakened as a result of a harmful effect in the internal light emitting efficiency.

The effectiveness of carrier confinement can further be increased, however, by making the refractive index of the window layer 5, which is located at a certain distance away from the active layer 3, greater than that of the second clad layer 4, while maintaining the effectiveness of carrier confinement without too increasing the refractive index of the second clad layer 4. That is to say, a layer having a great refractive index is used for the window layer 5, and thereby the difference between the refractive indexes which react with light in practice ($\Delta n_1$, hereinafter referred to as "effective refractive index difference"), becomes smaller than the theoretical difference between the refractive indexes ($\Delta n_2$) of the active layer 3 and the second clad layer 4, resulting in a further enhancement of light attraction in comparison with the case wherein the refractive index of the second clad layer 4 alone is increased. This indicates that light can be sufficiently attracted without increasing the refractive index of the second clad layer 4 (without reducing the band gap) to the extent that the effectiveness of carrier confinement is weakened, and as a result it becomes possible for the second clad layer 4 to get both sufficient effectiveness of carrier confinement and sufficient light attraction.

Here, as shown in FIG. 2, a substrate side (n-type) window layer 10 having the same components as the window layer 5 can be formed on the semiconductor substrate 1 side of the first clad layer 2. In this case, it is desired that the substrate side window layer 10 is made of a semiconductor having a refractive index smaller than that of the first clad layer 2. That is to say, if the refractive index of the n-type window layer 10 is greater than the refractive index of the first clad layer 2, the effective refractive index difference between of the first clad layer 2 and the active layer 3 is reduced in the same manner as described above, and light is attracted toward the substrate so that the amount of light absorbed by the substrate increases.

On the other hand, it becomes possible to make reflection occur at the interface between the first clad layer 2 and the n-type window layer 10, when the refractive index of the n-type window layer 10 is smaller than that of the first clad layer 2, and thereby it becomes possible to make light advancing toward the substrate 1 reflect so as to enhance the external quantum efficiency. Here, the same symbols used to denote the portions in FIG. 1A are attached to the corresponding portions in FIG. 2, and the descriptions thereof are omitted.

In this case, $Al_pGa_{1-p}As$ ($0.6 \leq p \leq 0.95$, for example p=0.9) can, for example, be used as the substrate side (n-type) window layer 10 when the first clad layer 2 is made of $In_{0.49}(Ga_{1-x}Al_x)_{0.51}P$ ($0.6 \leq x \leq 0.95$, for example x=0.9) or $Al_zGa_{1-z}As$ ($0.6 \leq z \leq 0.9$, for example z=0.85).

In order to manufacture such an LED chip, an n-type GaAs substrate 1 is placed in, for example, an MOCVD (Metal Organic Chemical Vapour Deposition) unit. And required gases of triethyl gallium (hereinafter referred to as TEG), trimethyl aluminum (hereinafter referred to as TMA), trimethyl indium (hereinafter referred to as TMIn), and phosphine (hereinafter referred to as $PH_3$) which are reactive gases, as well as $H_2Se$ which is an n-type dopant gas are introduced together with hydrogen ($H_2$) which is a carrier gas, so as to epitaxially grow the n-type clad layer 2 made of $In_{0.49}(Ga_{0.1}Al_{0.9})_{0.51}P$ having a carrier concentration of from approximately $1\times10^{16}$ cm$^{-3}$ to $1\times10^{18}$ cm$^{-3}$ and having a thickness of approximately 0.5 μm at a temperature from approximately 500° C. to 700° C.

Next, TMA which is a reactive gas is reduced, and TEG is increased so as to grow the active layer 3 made of, for example, non-doped $In_{0.49}(Ga_{0.8}Al_{0.2})_{0.51}P$ having a thickness of approximately 0.5 μm. Furthermore, the same reactive gases as for the n-type clad layer 2 as well as dimethyl zinc (DMZn) as a p-type dopant gas are introduced so as to grow the p-type clad layer 4 made of, for example, $In_{0.49}(Ga_{0.55}Al_{0.45})_{0.51}P$ having a carrier concentration of from approximately $1\times10^{17}$ cm$^{-3}$ to $1\times10^{18}$ cm$^{-3}$ and having a thickness of approximately 1 μm.

Then, supplies of $PH_3$ and TMIn are stopped while arsine ($AsH_3$) is introduced, so as to grow a p-type window layer 5 made of, for example, $Al_{0.7}Ga_{0.3}As$ grows having a carrier concentration of from approximately $1\times10^{17}$ cm$^{-3}$ to $1\times10^{20}$ cm$^{-3}$. Furthermore, supply of TMA is stopped so as to grow a p-type contact layer 6 made of, for example, GaAs, having a carrier concentration of from approximately $1\times10^{17}$ cm$^{-3}$ to $1\times10^{20}$ cm$^{-3}$.

Then, an Au—Ti alloy, an Au—Zn/Ni alloy, an Au—Be/Ni alloy or the like used for p-side electrode is deposited on the contact layer 6 and this metal film for electrode is patterned as shown in FIG. 1A so as to form the p-side electrode 7. The portion which is not covered by the p-side electrode 7 of p-type the contact layer 6 is etched and removed while using the p-side electrode 7 as a mask so that the p-type contact layer 6 is patterned.

Next, a photolithographic technology is used in order to divide the wafer into individual chips, wherein the surface of the wafer, excepting the element isolation regions, is covered with a resist so as to etch the isolation region at room temperature for approximately 3 minutes (rate: 0.6 μm/min) to the depth reaching to the semiconductor substrate 1 in a liquid which hydrochloric acid and water are mixed at a ratio of 2:1. After that, a film is formed of an Au—Ge/Ni alloy or the like on the entire surface of the rear side of the semiconductor substrate 1 so as to form the n-side electrode 8 after the resist that has covered the elements is removed and the wafer is diced and divided into chips. In addition, the wafer can be divided into chips solely by means of dicing without using photolithographic technology.

According to the present invention, the ratio of absorption of light which is emitted from the light emitting layer in the semiconductor substrate can be reduced, and the external quantum efficiency can be enhanced by attracting light toward the top surface. That is to say, according to the prior art, when the active layer is made by a thin film and the amount of light emitted from the active layer to the substrate side is increased and, therefore, the light is absorbed by the substrate and the external quantum efficiency is not significantly increased; even when the light is not absorbed by the substrate the manufacturing process becomes complicated, and the current density increases in the active layer to increase in the temperature of the active layer and to lower the reliability of the device.

On the other hand, according to the present invention, light is attracted toward the top surface because the refractive index of the second clad layer is greater than the refractive index of the first clad layer. Furthermore, the refractive index of the window layer is greater than that of the second clad layer and, therefore, the effective refractive index difference between the active layer and the second clad layer is smaller than the theoretical refractive index difference, so that it becomes possible to further enhance the light attraction toward the top surface and to increase the external quantum efficiency in comparison with the case wherein the refractive index of the second clad layer alone is increased.

Although preferred examples have been described in some detail it is to be understood that certain changes can be made by those skilled in the art without departing from the spirit and scope of the invention as defined by the appended claims.

What is claimed is:

1. A semiconductor light emitting device, comprising:
   a semiconductor substrate;
   a light emitting layer forming portion provided on said semiconductor substrate, in which an active layer made of a compound semiconductor is sandwiched between a first clad layer and a second clad layer made of compound semiconductor having band gap greater than that of said active layer, respectively and having a different conductivity type each other; and
   a window layer provided at least above said second clad layer,
   wherein said second clad layer is made of a compound semiconductor having a refractive index greater than that of said first clad layer provided on said semiconductor substrate side, and
   wherein said window layer is made of a compound semiconductor having a refractive index greater than that of said second clad layer.

2. The semiconductor light emitting device according to claim 1, wherein the refractive index of said second clad layer is greater than the refractive index of said first clad layer by 6% to 4%.

3. The semiconductor light emitting device according to claim 1, wherein said first clad layer is made of $In_{0.49}(Ga_{1-s}Al_s)_{0.51}P$ ($0.6 \leqq s \leqq 1$) and said second clad layer is made of $In0.49(Ga_{1-y}Al_y)_{0.51}P$ ($0.4 \leqq y \leqq 0.75$, y<s).

4. The semiconductor light emitting device according to claim 3, wherein said window layer is made of $Al_vGa_{1-v}As$ ($0.6 \leqq v \leqq 0.85$).

5. The semiconductor light emitting device according to claim 1, wherein said first clad layer is made of $Al_zGa_{1-z}As$ ($0.6 \leqq z \leqq 0.9$) and said second clad layer is made of $Al_uGa_{1-u}As$ ($0.4 < u \leqq 0.85$, u<z).

6. The semiconductor light emitting device according to claim 5, wherein said window layer is made of $Al_wGa_{1-w}As$ ($0.4 \leqq w \leqq 0.7$, w<u).

7. A semiconductor light emitting device, comprising:
   a semiconductor substrate;
   a light emitting layer forming portion provided on said semiconductor substrate, in which an active layer made of a compound semiconductor is sandwiched between a first clad layer and a second clad layer made of compound semiconductor having band gap greater than that of said active layer, respectively and having a different conductivity type each other; and
   a window layer provided at least above said second clad layer,
   wherein said second clad layer is made of a compound semiconductor having a refractive index greater than that of said first clad layer provided on said semiconductor substrate side;
   wherein a substrate side window layer is formed on said semiconductor substrate side of said first clad layer and said substrate side window layer is made of a material having a refractive index smaller than that of said first clad layer.

* * * * *